(12) United States Patent
Jung et al.

(10) Patent No.: US 7,842,219 B2
(45) Date of Patent: Nov. 30, 2010

(54) MOLD FOR FORMING A MOLDING MEMBER AND METHOD OF FABRICATING A MOLDING MEMBER USING THE SAME

(75) Inventors: Jung Hwa Jung, Seoul (KR); Chung Hoon Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 408 days.

(21) Appl. No.: 11/995,196

(22) PCT Filed: Jun. 26, 2006

(86) PCT No.: PCT/KR2006/002462

§ 371 (c)(1),
(2), (4) Date: Jan. 9, 2008

(87) PCT Pub. No.: WO2007/007959

PCT Pub. Date: Jan. 18, 2007

(65) Prior Publication Data

US 2008/0268559 A1 Oct. 30, 2008

(30) Foreign Application Priority Data

Jul. 13, 2005 (KR) .................. 10-2005-0063361

(51) Int. Cl.
*B29C 45/14* (2006.01)
*B29C 45/26* (2006.01)
*H01L 21/56* (2006.01)
(52) U.S. Cl. .................. 264/272.17; 249/120; 425/127; 425/129.1; 438/127
(58) Field of Classification Search .................. 425/116, 425/127, 129.1; 249/120; 264/272.17; 438/112, 438/127
See application file for complete search history.

(56) References Cited

U.S. PATENT DOCUMENTS 2,714,267 A * 8/1955 Innerfield .................... 425/121
3,266,099 A * 8/1966 Bucy .......................... 249/141
4,095,637 A * 6/1978 Krishnan .................... 152/323

(Continued)

FOREIGN PATENT DOCUMENTS

DE 3809969 10/1989

(Continued)

OTHER PUBLICATIONS

European Search Report issued Mar. 12, 2010 by the European Patent Office in European Patent Application No. 06769040.4.

*Primary Examiner*—Robert B Davis
(74) *Attorney, Agent, or Firm*—H.C. Park & Associates, PLC

(57) ABSTRACT

There are provided a mold for forming a molding member and a method for forming a molding member using the same. The mold includes an upper surface, and a lower surface having an outer peripheral surface and a concave surface surrounded by the outer circumference. Injection and discharge holes extend from the upper surface to the lower surface. Accordingly, after the mold and the package are coupled so that the discharge hole is directed upward, a molding member can be formed on the package by injecting the molding material through the injection hole, whereby it is possible to prevent air bubbles from being captured in the molding member.

18 Claims, 4 Drawing Sheets

U.S. PATENT DOCUMENTS

| | | | |
|---|---|---|---|
| 5,834,035 A | 11/1998 | Osada et al. | |
| 6,407,461 B1 | 6/2002 | Farquhar et al. | |
| 6,448,665 B1 | 9/2002 | Nakazawa et al. | |
| 6,652,795 B2 | 11/2003 | Konishi et al. | |
| 6,818,169 B2 | 11/2004 | Umemoto | |
| 2003/0168720 A1* | 9/2003 | Kamada | 257/666 |
| 2005/0139850 A1 | 6/2005 | Ikeda | |
| 2009/0162957 A1* | 6/2009 | Joung, II | 438/27 |

FOREIGN PATENT DOCUMENTS

| | | | |
|---|---|---|---|
| JP | 06151492 A | * | 5/1994 |
| JP | 09162210 A | * | 6/1997 |
| JP | 2000012576 A | * | 1/2000 |
| WO | 03/050865 | | 6/2003 |
| WO | WO 2006137647 A1 | * | 12/2006 |
| WO | WO 2009070950 A1 | * | 6/2009 |

* cited by examiner

MOLD FOR FORMING A MOLDING MEMBER AND METHOD OF FABRICATING A MOLDING MEMBER USING THE SAME

RELATED APPLICATIONS

This application is a U.S. national phase application of PCT International Application No. PCT/KR2006/002462, filed Jun. 26, 2006, which claims priority of Korean Patent Application No. 10-2005-0063361, filed Jul. 13, 2005, the contents of which are incorporated herein by reference in their entirety.

FIELD OF THE INVENTION

The present invention relates to a mold and a method for forming a molding member using the same, and more particularly, to a mold for forming a lens-shaped molding member on a package and a method for forming a molding member using the same.

BACKGROUND OF THE INVENTION

Generally, a light emitting device includes a package with an LED (Light Emitting Diode) mounted thereon and a lens for covering the LED for improving a light emission efficiency within a certain range of viewing angles. This lens may be produced in advance by casting or the like and then coupled on the package, but the lens and package are weakly adhered. Accordingly, a molding technique is used to form a lens-shaped molding member on a package with an epoxy or silicone resin.

A method of forming a molding member using resin is disclosed in U.S. Patent Publication No. 2003/0168720, by Kamada, entitled "Semiconductor Device and Manufacturing Method for same." FIG. 1 is a sectional view illustrating a method of forming a molding member by Kamada.

Referring to FIG. 1, a metal plate is perforated to form a frame including metal leads (not shown), an air vent frame 303, and an injection frame 305, and a pressing process is performed to position ends of the metal leads below the frames 303 and 305, thereby completing the frame.

Then, a package support 304 (or a package body) is formed by injection molding. At this time, a heat sink 302 and the lead frame may be insertion-molded in a die to form the package body 304. The package body 304 has a recess exposing the ends of the metal leads and the heat sink 302 and has gates 306 adjacent to the frames 303 and 305.

Thereafter, an LED 301 is mounted on the heat sink 302 and is electrically connected to the metal leads through wire bonding.

Subsequently, a predetermined surface of an upper mold 401 is pressed to be adjacent to an upper surface of the package body 304. The upper mold 401 is shaped to have a trench for guiding a molding material to be injected, a trench for guiding gas, and recesses and protrusions for forming the molding member into a desired shape. The molding material flows to the gate 306 along the upper surface of the injection frame 305, and gas is discharged along the upper surface of the air vent frame 303 as being filled with the molding material. Accordingly, a space 403 is filled with the molding material, thereby forming a molding member with a desired shape. Meanwhile, a lower mold 402 having a recess receiving the package body 304 is pressed so that the entire package body 304 and the lead frame are in place.

According to the conventional method, there are advantages in that several molding members can be successively formed using a transfer molding method and resin burrs can be prevented by adopting the frames 303 and 305.

However, when the space 403 is filled with the molding material, the gate 306 at a side of the air vent frame 303 may be clogged with the molding material before the space 403 is completely filled with the molding material. Accordingly, the gas in the space 403 may not be discharged completely, but captured in the molding material. The gas captured in the molding material may cause inferior curing of the molding member and decrease uniformity and efficiency of the light emitted through the molding member.

An object of the present invention is to provide a mold capable of preventing gas from being captured in a molding material.

Another object of the present invention is to provide a method of forming a molding member, which can prevent gas from being captured in the molding material.

A further object of the present invention is to provide a method of forming a molding member, which can prevent burr from being generated.

In order to accomplish these objects, the present invention provides an improved mold for forming a molding member on a package, and a method of forming a molding member using the mold. In one aspect of the present invention, there is provided a mold including an upper surface; and a lower surface having an outer peripheral surface and a concave surface surrounded by the outer peripheral surface. Injection and discharge holes extend from the upper surface to the lower surface. Accordingly, after the mold and the package are coupled so that the discharge hole is directed upward, a molding material can be injected through the injection hole to form a molding member on the package, whereby it is possible to prevent air bubbles from being captured in the molding member.

The injection and discharge holes may extend from the upper surface to the outer peripheral surface of the lower surface. Accordingly, it may be prevented that the molding material contained in the injection and discharge holes is remained on the upper surface of the molding member with a desired shape.

In another aspect of the present invention, there is provided a method of forming a molding member. The method comprises preparing a mold including an upper surface, and a lower surface having an outer peripheral surface and a concave surface surrounded by the outer peripheral surface. The mold includes injection and discharge holes extending from the upper surface to the lower surface. In addition, a package having an LED mounted thereon is prepared. The package and the mold are coupled to each other. At this time, the package and the mold are coupled so that the concave surface covers the LED, the outer peripheral surface is adjacent to an upper surface of the package, an edge portion of the package adjacent to the discharge hole is directed upward, and another edge portion opposite to the edge portion of the package is directed downward. Then, a molding material is injected into the injection hole. As the molding material is injected into the injection hole, a space between the concave surface and the upper surface of the package is filled with the molding material, and inner gas is discharged through the discharge hole. Since the discharge hole is positioned in an upper portion, the gas in the space can be discharged before the discharge hole is clogged with the molding material. Accordingly, it is prevented that the gas is captured in the molding material.

Meanwhile, the preparation of the package comprises preparing a lead frame having lead electrodes. The package body is formed on the lead frame. The package body has a recess exposing the lead electrodes. In addition, the lead electrodes protrude out of the package body. The LED is mounted in the recess region, and the LED is electrically connected with the lead electrodes.

The package body may have a guide groove for guiding the molding material injected through the injection hole toward the recess and a guide groove for guiding inner gas to the discharge hole. Accordingly, it is prevented that the molding material contained in the injection and discharge holes is remained on the upper surface of the molding member with a desired shape.

According to the present invention, it is possible to provide an improved mold capable of preventing gas from being captured in a molding material, and also to provide a method of forming a molding member capable of preventing gas from being captured in the molding material using the mold. In addition, the present invention may provide a method of forming a molding member capable of preventing resin burrs from being generated on lead electrodes.

DESCRIPTION OF THE DRAWINGS

FIGS. 2 to 5 are sectional views illustrating a method of forming a molding member according to an embodiment of the present invention, wherein FIG. 3 is an exploded sectional view of FIG. 2;

DETAILED DESCRIPTION

Figure 1:
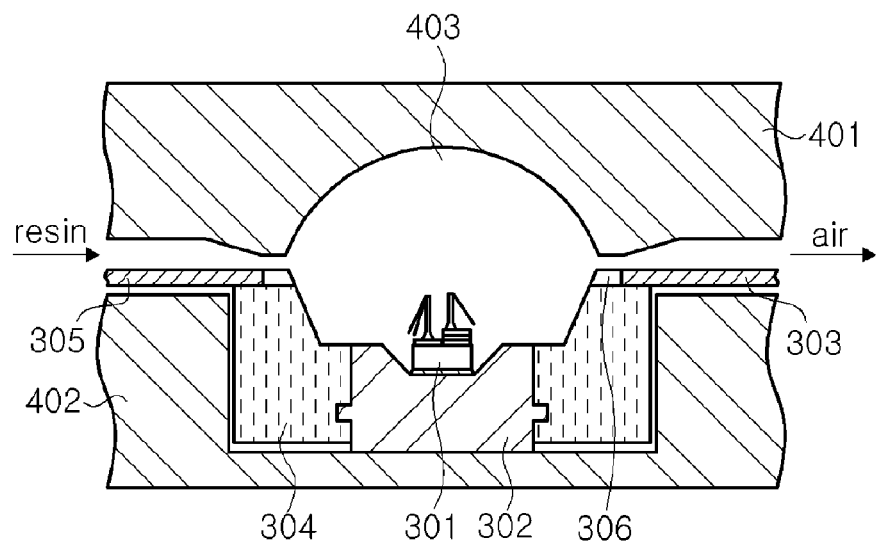
FIG. 1 is a sectional view illustrating a conventional method of forming a molding member.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 2:
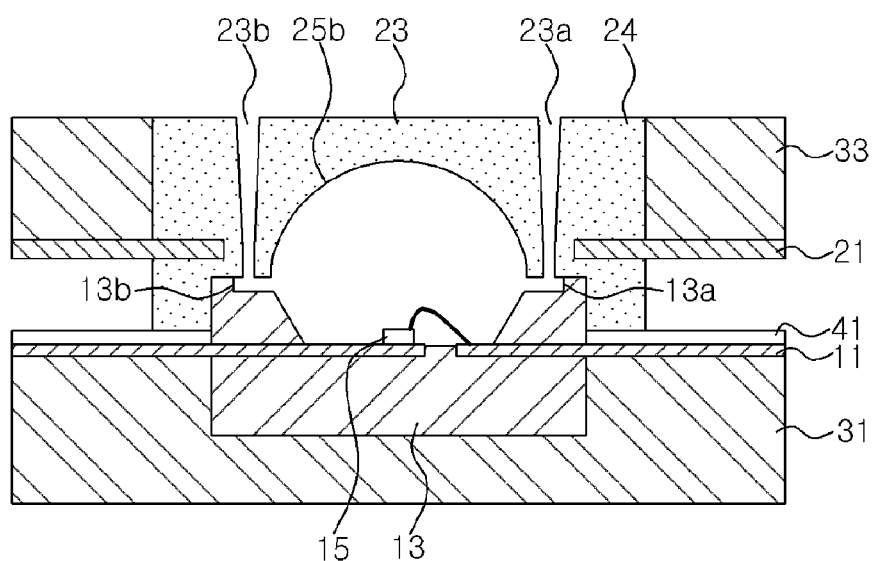
Figure 3:
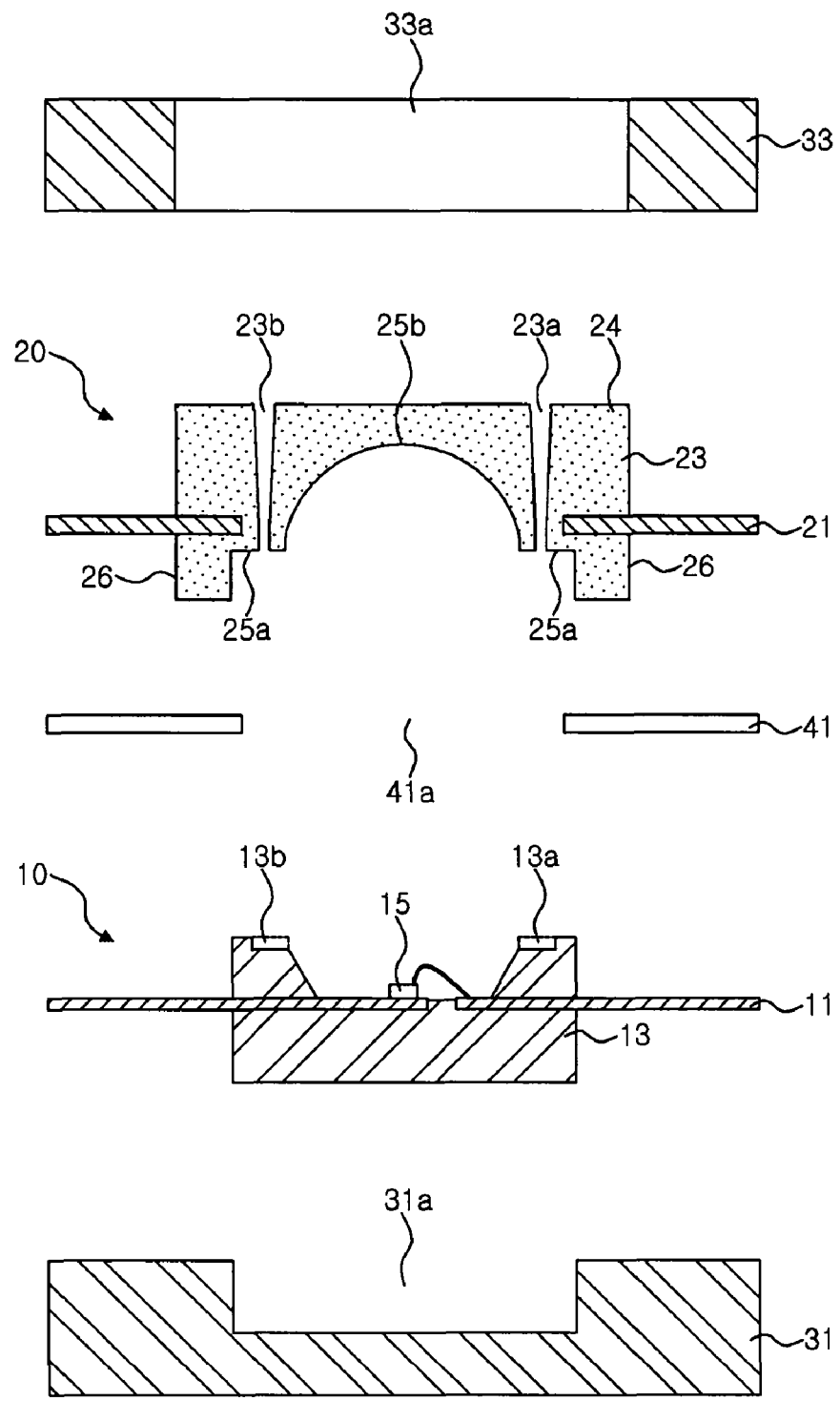

FIGS. 2 to 5 are sectional views illustrating a method of forming a molding member according to an embodiment of the present invention. Here, FIG. 3 is an exploded sectional view of FIG. 2.

Referring to FIGS. 2 and 3, a mold 20 for forming a molding member on a package is prepared. The mold 20 has an upper surface 24, and a lower surface having an outer peripheral surface 25a and a concave surface 25b surrounded by the outer peripheral surface. The upper surface 24 and the lower surface may be connected through a side as shown in the figures, but it is not limited thereto, and the upper surface 24 and the lower surface may be connected with each other without any side. Thus, the upper surface of the mold 20 is not limited to a flat surface, but may have various shapes.

The concave surface of the mold 20 has a shape corresponding to a molding member with a desired shape. Grooves and/or protrusions may be formed in the concave surface.

Meanwhile, the outer peripheral surface 25a which is adjacent to an upper surface of the package may be a flat surface, but it is not limited thereto. The outer peripheral surface 25a may also be an inclined surface for forming a space between the upper surface of the package and the outer peripheral surface 25a of the mold 20, or grooves may be formed in the outer peripheral surface 25a. In addition, a protrusion 26 for surrounding a sidewall of the package may be formed on an edge of the outer peripheral surface 25a. The protrusion 26 may be continuous or discontinuous along the edge of the outer peripheral surface 25a.

An injection hole 23a and a discharge hole 23b extend from the upper surface 24 to the lower surface. The injection and discharge holes 23a and 23b are through-holes passing through the mold 20. The injection and discharge holes 23a and 23b may respectively extend from the upper surface 23 to the concave surface 25b, but preferably extend to the outer peripheral surface 25a. At this time, the outer peripheral surface 25a having the discharge hole 23a formed therethrough may have a groove (not shown) connected from the discharge hole 23b to the concave surface 25b. The groove forms a sufficient space between the upper surface of the package and the mold, thereby allowing air to be easily discharged. Meanwhile, the injection and discharge holes 23a and 23b may be arranged to face each other with the concave surface 25b being interposed therebetween as shown in the figures, but they are not limited thereto. The injection and discharge holes are spaced apart from each other.

The mold 20 may be formed using an injection molding technique. At this time, a connection frame 21 may be insertion-molded to form a plurality of molds 20, and accordingly a plurality of the molds 20 may be connected to each other by the connection frame 21 and used as a single unit.

The injection hole 23a is formed to be perpendicular to the connection frame 21 or preferably to be inclined from a center of the upper surface 24 toward the outside of the lower surface. It will be explained below. Meanwhile, like the injection hole 23a, the discharge hole 23b may also be formed to be perpendicular or inclined.

In the meantime, a package 10 with an LED 15 mounted thereon is prepared. The preparation of the package 10 includes preparing a lead frame 11 having lead electrodes. The lead frame 11 may be formed by perforating a metal plate such as Cu or Al plate. According to the prior art, ends of the lead electrodes are positioned below the frame using a pressing process, but this process can be excluded from the embodiments of the present invention.

Thereafter, a package body 13 having a recess exposing the lead electrodes is formed on the lead frame 11. The package body 13 may be formed using an insertion molding technique and made of thermosetting or thermoplastic resin. Guide grooves 13a and 13b connected to the recess may be formed in the upper surface of the package body 13. The guide groove 13a is formed at a position corresponding to the injection hole 23a of the mold 20, and the guide groove 13b is formed at a position corresponding to the discharge hole 23b of the mold 20. Meanwhile, the lead electrodes protrude out of the package body 13. For convenience, the package 13 is classified into an upper part and a lower part with respect to the lead electrodes.

Meanwhile, the LED 15 is mounted in the recess region. The LED 15 may be mounted on the lead electrode as shown in the figures, but it is not limited thereto. The LED 15 may also be mounted on the upper surface of the package body 13 in the recess. The LED 15 is electrically connected to the lead electrodes through bonding wires. In a case of a 1-bond die having electrodes formed on its upper and lower surfaces respectively, the LED 15 may be adhered on the lead electrode using a conductive adhesive and the upper electrode of the LED 15 may be connected to the other lead electrode through a bonding wire. In a case of a 2-bond die having two electrodes formed on its upper surface, two electrodes of the LED 15 are connected to the lead electrodes through bonding wires. Meanwhile, the LED 15 may be mounted on a submount (not shown), and the sub-mount may be connected to the lead electrodes through bonding wires.

The package 10 is coupled to the mold 20 so that the concave surface 25b of the mold covers the LED 15 and the outer peripheral surface 25a is adjacent to the upper surface of the package body 13. At this time, the protrusion 26 of the mold 20 surrounds the upper part of the package body 13. The protrusion 26 reduces leakage of the molding material between the mold 20 and the package body 13, and also aligns the mold 20 and the package body 10.

Meanwhile, in order to prevent a molding material leaked between the mold 20 and the package body 13 from being adhered to the lead electrodes, the lead frame 11 may be covered with a cover seat 41. The cover seat 41 has a through-hole 41a through which the package body 13 is allowed to pass.

In the embodiments of the present invention, the mold 20 and the package 10 are securely coupled, and various coupling means may be used for this purpose. For example, as shown in the figures, the mold 20 and the package 10 may be coupled using jigs 31 and 33.

More specifically, the lower jig 31 has a recess 31a for receiving the package body 13. The lower part of the package body 13 is received in the recess 31a of the lower jig 31, and the lead frame 11 is seated on the upper surface of the lower jig 31. Meanwhile, the cover seat 41 may cover not only the lead frame 11 but also the upper surface of the lower jig 31, and may also prevent the molding material from being adhered to the lower jig 31.

In the meantime, the upper jig 33 is coupled to an upper portion of the mold 20 and presses the mold 20 against the lower jig 31. The upper jig 33 has a through-hole 33a for exposing the injection and discharge holes 23a and 23b of the mold 20. The through-hole 33a may be sized such that the upper surface 24 of the mold 20 may pass therethrough, as shown in the figures, but it is not limited thereto and the through-hole 33a may have various sizes and/or shapes. In a case where a plurality of the molds 20 are connected with the connection frame 21, the upper jig 33 may press the connection frame 21 so that the mold 20 is pressed toward the lower jig 31. Then, the lower jig 31 and the upper jig 33 are coupled using a fastening means such as pins, screws or clamps (not shown). Accordingly, the mold 20 and the package 10 may be securely coupled to each other.

Figure 4:
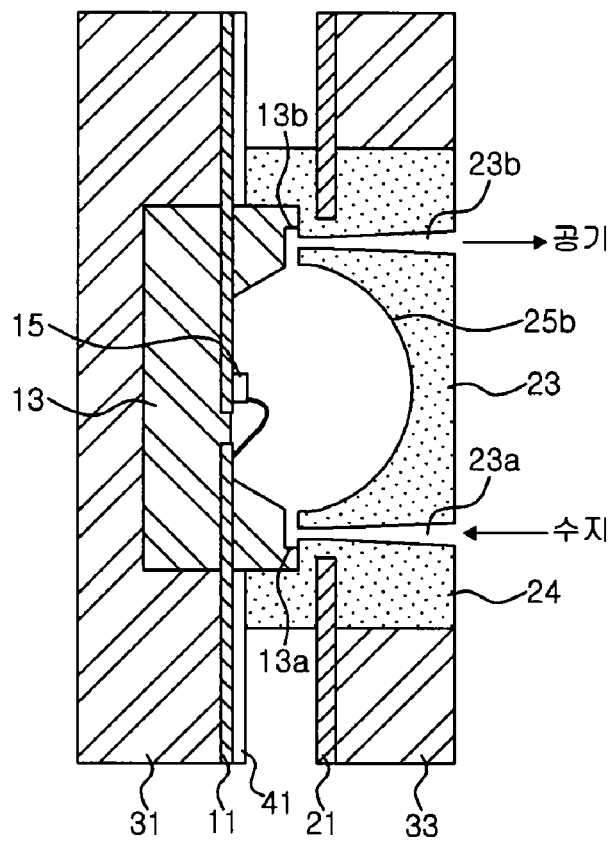

Referring to FIG. 4, the mold 20 and the package 10 coupled with each other are rotated such that an edge portion of the package body 13 adjacent to the discharge hole 23b is directed upward and the other portion opposite to the edge portion of the package body 13 is directed downward. Accordingly, in the space surrounded by the package body 13 and the mold 20, the guide groove 13b is positioned above. Meanwhile, in a case where the injection hole 23a is formed at a position opposite to the discharge hole 23b, the injection hole 23a and the guide groove 13a are positioned below.

In this embodiment, the mold 20 and the package 10 are rotated after being coupled, but the mold 20 and the package 10 may also be coupled after being rotated.

Then, a molding material such as epoxy or silicone resin is injected through the injection hole 23a. The molding material may contain phosphors and/or diffusers. The molding material fills the space from its bottom, and the gas in the space is discharged to the outside through the guide groove 13b and the discharge hole 23b. Since the guide groove 13b and the discharge hole 23b are positioned in the upper portion of the space, the gas may be continuously discharged through the discharge hole 23b until the space is completely filled with the molding material. Accordingly, it is prevented that the inner gas is captured in the molding material.

Meanwhile, in order to prevent the molding material from flowing back through the injection hole 23a, the injection hole 23a is formed to be perpendicular to the upper surface of the package body 13 or preferably to be inclined toward the center of the mold 20 from the lower surface to the upper surface 24 of the mold 20.

Figure 5:
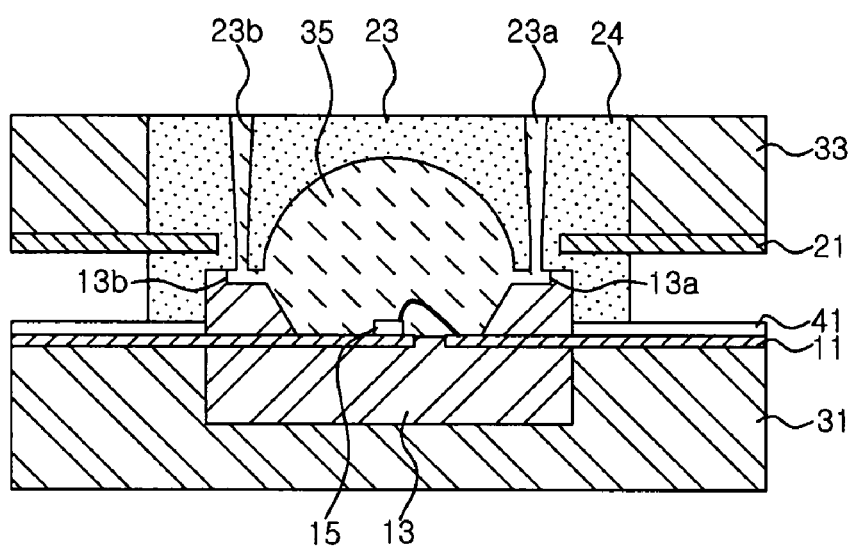

Referring to FIG. 5, after the space is completely filled with the molding material, the molding material is cured and forms a molding member 35. The molding material may be cured in a state where the jigs 31, 33 are coupled. Also, the curing process may also be conducted after the mold 20 rotates to face upward.

Figure 6:
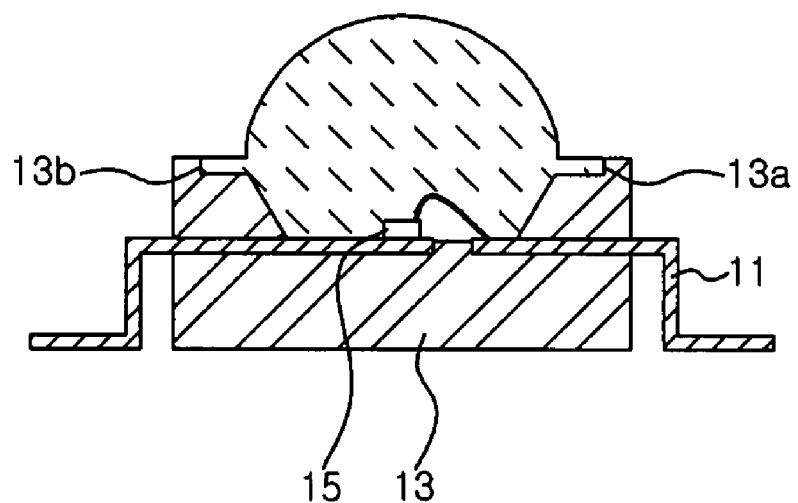
FIG. 6 is a sectional view illustrating a molding member formed according to the embodiment of the present invention.

Referring to FIG. 6, after the curing process is completed, the jigs 31 and 33 and the cover seat 41 are separated and removed. As a result, a package with the molding member 35 of a desired shape is completed.

The shape of the molding member 35 is determined according to the shape of the concave surface 25b of the mold 20. Thus, it is possible to form the molding member 35 of a variety of shapes by changing the shape of the concave surface 25b of the mold 20. The molding material, which is connected to the molding member 35 and cured in the guide grooves 13a and 13b, may remain therein.

In this embodiment, it has been exemplarily explained that the molding member 35 is formed on the package 10 with a recess, but the present invention is not limited thereto. The present invention may also be applied to a case where a molding member to cover an LED is formed on a package without a recess. Meanwhile, the present invention may also be applied to a package employing a heat sink, and FIG. 7 is a sectional view illustrating a method of forming such a package 50.

Figure 7:
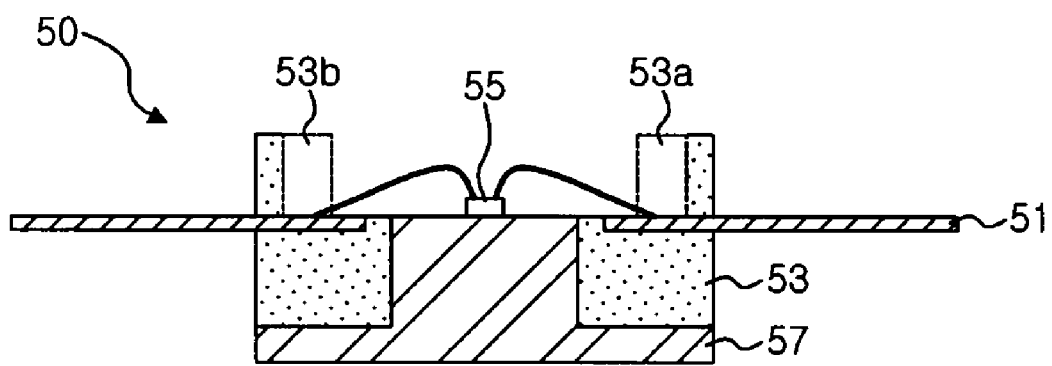
FIG. 7 is a sectional view of a package, which illustrates a method of forming a molding member according to another embodiment of the present invention.

Referring to FIG. 7, a lead frame 51 is formed by a perforating process as described with reference to FIGS. 2 and 3. At this time, ends of lead electrodes are spaced apart from each other. Then, a package body 53 with a recess exposing the lead electrodes is formed. The package body 53 also has a through-hole connected to the recess and passing through the lower surface of the package body 53. Meanwhile, the package body 53 may have guide grooves 53a and 53b in its upper surface, like the package body 13 of FIG. 2. The guide grooves 53a and 53b may be modified in various ways and expose the lead electrodes as shown in the figure.

Meanwhile, a heat sink 57 is inserted into the through-hole. The heat sink 57 may have a wide lower surface in order to promote heat dissipation and also have a protrusion on its center region. The protrusion is inserted into the through-hole and protrudes into the recess region.

An LED 55 is mounted on the upper surface of the heat sink 57 and electrically connected to the lead electrodes through bonding wires. The lead electrodes and the LED may be connected through the bonding wire in various ways. In a case where the heat sink 57 is conductive, the heat sink and the lead electrode may be connected using a bonding wire.

In this embodiment, the heat sink 57 is inserted after the package body 53 is formed, but it is not limited thereto. The heat sink and the lead frame may also be insertion-molded together to form a package body as in the prior art. After the heat sink 57 is coupled to the lead frame 51 in advance, the heat sink and the lead frame may also be insertion-molded to form a package body.

Then, the processes as explained with reference to FIGS. 2 to 6 are performed to form a molding member to the package 50.

The invention claimed is:

1. A mold for forming a molding member on a package, comprising:
   an upper surface;
   a lower surface having an outer peripheral surface and a concave surface surrounded by the outer peripheral surface; and
   injection and discharge holes extending from the upper surface to the lower surface,
   wherein the mold is formed by insertion-molding a connection frame.

2. The mold as claimed in claim 1, wherein the injection and discharge holes extend from the upper surface to the outer peripheral surface of the lower surface.

3. The mold as claimed in claim 2, wherein the injection and discharge holes are positioned to be opposite to each other with the concave surface being interposed therebetween.

4. The mold as claimed in claim 1, wherein the outer peripheral surface is substantially flat.

5. The mold as claimed in claim 1, further comprising a protrusion provided on an edge of the outer peripheral surface to surround a sidewall of the package.

6. A method of forming a molding member, comprising:
   preparing a mold including an upper surface, a lower surface having an outer peripheral surface and a concave surface surrounded by the outer peripheral surface, and injection and discharge holes extending from the upper surface to the lower surface;
   preparing a package having an LED (Light Emitting Diode) mounted thereon;
   coupling the package and the mold so that the concave surface covers the LED, the outer peripheral surface is adjacent to an upper surface of the package, an edge portion of the package adjacent to the discharge hole is directed upward, and an other edge portion opposite to the edge portion of the package body is directed downward; and
   injecting a molding material into the injection hole,
   wherein the mold is formed by insertion-molding a connection frame.

7. The method as claimed in claim 6, wherein the injection and discharge holes extend from the upper surface to the outer peripheral surface of the mold.

8. The method as claimed in claim 7, wherein the injection and discharge holes are positioned to be opposite to each other with the concave surface being interposed therebetween.

9. The method as claimed in claim 6, wherein the injection hole is formed to be substantially perpendicular to an upper surface of the package or inclined upward from the lower surface to the upper surface of the mold, when the mold and the package are coupled.

10. The method as claimed in claim 7, wherein the outer peripheral surface is substantially flat.

11. The method as claimed in claim 6, wherein the preparation of the package having the LED mounted thereon comprises:
    preparing a lead frame having lead electrodes;
    forming on the lead frame a package body with a recess exposing the lead electrodes, wherein the lead electrodes protrude out of the package body;
    mounting the LED in the recess region; and
    electrically connecting the LED with the lead electrodes.

12. The method as claimed in claim 11, wherein the package body is formed to have a guide groove for guiding the molding material injected through the injection hole to the recess and a guide groove for guiding inner gas to the discharge hole.

13. The method as claimed in claim 11, further comprising:
    coupling a heat sink to the package body after the formation of the package body,
    wherein an upper surface of the heat sink protrudes into the recess region, and the LED is mounted on the upper surface of the heat sink.

14. The method as claimed in claim 11, further comprising:
    coupling a heat sink to the lead frame prior to the formation of the package body, wherein the LED is mounted on an upper surface of the heat sink.

15. The method as claimed in claim 11, wherein coupling the package and the mold comprises:
    inserting a lower part of the package body into a recess of a lower jig, wherein the lead frame is seated on an upper surface of the lower jig;
    covering the lower jig and the lead frame using a cover seat, the cover seat having a through-hole through which the package body is allowed to pass for an upper part of the package body to protrude upward from the cover seat;
    arranging the mold on the package body;
    pressing the mold against the package body using an upper jig having a through-hole for exposing the injection and discharge holes of the mold therethrough; and
    fixing the mold by coupling the upper jig and the lower jig.

16. The method as claimed in claim 15, wherein coupling the package and the mold further comprises rotating the jigs after the upper and lower jigs are coupled.

17. The mold as claimed in claim 1, wherein the outer peripheral surface of the lower surface surrounds the injection and discharge holes.

18. The method as claimed in claim 15, wherein the outer peripheral surface of the lower surface surrounds the injection and discharge holes.

* * * * *